(12) United States Patent
Hayashi

(10) Patent No.: US 10,455,699 B2
(45) Date of Patent: Oct. 22, 2019

(54) MULTILAYER CERAMIC SUBSTRATE AND METHOD FOR MANUFACTURING SAME

(71) Applicant: HITACHI METALS, LTD., Minato-ku, Tokyo (JP)

(72) Inventor: Kenji Hayashi, Osaka (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 15/547,882

(22) PCT Filed: Oct. 17, 2016

(86) PCT No.: PCT/JP2016/080739
§ 371 (c)(1),
(2) Date: Aug. 1, 2017

(87) PCT Pub. No.: WO2017/069093
PCT Pub. Date: Apr. 27, 2017

(65) Prior Publication Data
US 2018/0220532 A1 Aug. 2, 2018

(30) Foreign Application Priority Data

Oct. 19, 2015 (JP) .................................. 2015-205580

(51) Int. Cl.
*H05K 1/11* (2006.01)
*H05K 3/46* (2006.01)
(Continued)

(52) U.S. Cl.
CPC ........... *H05K 1/113* (2013.01); *H05K 3/4644* (2013.01); *H05K 3/4679* (2013.01);
(Continued)

(58) Field of Classification Search
CPC ...... H05K 1/113; H05K 1/0306; H05K 1/162; H05K 3/34; H05K 3/4061; H05K 3/46;
(Continued)

(56) References Cited

U.S. PATENT DOCUMENTS 5,388,328 A * 2/1995 Yokono ............... H01L 21/4857
174/267
6,391,669 B1 * 5/2002 Fasano .................... H01L 22/34
29/593

(Continued)

FOREIGN PATENT DOCUMENTS

JP   04-010591   1/1992
JP   04-015991   1/1992
(Continued)

OTHER PUBLICATIONS

International Search Report for PCT/JP2016/080739 dated Nov. 22, 2016.

*Primary Examiner* — Steven T Sawyer
*Assistant Examiner* — Paresh H Paghadal
(74) *Attorney, Agent, or Firm* — Nixon Peabody LLP; Jeffrey L. Costellia

(57) ABSTRACT

A multilayer ceramic substrate includes: a plurality of ceramic layers 300a, 300b stacked together; a via hole 400a, 400b provided in each of the plurality of ceramic layers, the via holes of the plurality of ceramic layers being connected together in a layer stacking direction of the plurality of ceramic layers; a via wire 406a, 406b including an electrical conductor filled into each of the via holes; a first conductor 404a, 404b provided on an upper surface of at least one of the plurality of ceramic layers, the first conductor having an annular or partially annular shape surrounding the via wire; and a second conductor 403a, 403b including a first portion and a second portion, the first portion being located outside the first conductor on the upper surface of the at least one
(Continued)

ceramic layer, the second portion overlying the first conductor, and an inner rim of the second portion being located outside an inner rim of the first conductor, wherein a thickness of the first conductor 404a, 404b is greater than a thickness of the second conductor 403a, 403b.

14 Claims, 9 Drawing Sheets

(51) Int. Cl.
| | |
|---|---|
| H01L 21/48 | (2006.01) |
| H01L 23/498 | (2006.01) |
| H05K 1/03 | (2006.01) |
| H05K 1/16 | (2006.01) |
| H05K 3/00 | (2006.01) |
| H05K 3/40 | (2006.01) |

(52) U.S. Cl.
CPC ........ *H01L 21/486* (2013.01); *H01L 21/4857* (2013.01); *H01L 23/49822* (2013.01); *H01L 23/49838* (2013.01); *H05K 1/0306* (2013.01); *H05K 1/116* (2013.01); *H05K 1/162* (2013.01); *H05K 3/005* (2013.01); *H05K 3/0029* (2013.01); *H05K 3/4061* (2013.01); *H05K 2201/098* (2013.01); *H05K 2201/09809* (2013.01); *H05K 2201/09827* (2013.01); *H05K 2201/09854* (2013.01); *H05K 2203/0108* (2013.01); *H05K 2203/107* (2013.01); *H05K 2203/166* (2013.01)

(58) Field of Classification Search
CPC .... H05K 3/4644; H05K 3/0029; H05K 3/005; H05K 2201/098; H05K 2201/09827; H05K 2201/09854; H05K 2203/0108; H05K 2203/107; H05K 2203/166; H05K 3/04679; H05K 1/115; H05K 1/116; H05K 2201/09809; H01L 21/4857; H01L 21/486; H01L 23/49822; H01L 23/49838
See application file for complete search history.

(56) References Cited

U.S. PATENT DOCUMENTS

| | | | |
|---|---|---|---|
| 8,188,604 B2* | 5/2012 | Yamada | ............ H01L 21/76898 |
| | | | 257/114 |
| 8,492,896 B2* | 7/2013 | Nakano | .................. H01L 24/05 |
| | | | 257/737 |
| 2004/0125539 A1 | 7/2004 | Murakami et al. | |
| 2009/0126856 A1 | 5/2009 | Kobayashi | |

FOREIGN PATENT DOCUMENTS

| JP | 08-274467 | 10/1996 |
|---|---|---|
| JP | 11-074645 | 3/1999 |
| JP | 2009-152531 | 7/2009 |
| JP | 2014-222686 | 11/2014 |

* cited by examiner (a)

(b)

(a)

(b)

MULTILAYER CERAMIC SUBSTRATE AND METHOD FOR MANUFACTURING SAME

TECHNICAL FIELD

The present disclosure relates to a multilayer ceramic substrate and a manufacturing method thereof.

BACKGROUND ART

Multilayer ceramic substrates have been used in packages containing semiconductor devices and the like, interposers, antenna switch modules in which a front-end circuit for communication devices is incorporated, amplifier modules, filter modules, antennas, etc.

In the multilayer ceramic substrate, a plurality of ceramic layers are stacked up, and a wiring layer which is realized by an electrode pattern formed by screen printing or a reactance function layer which forms inductance and capacitance is provided between respective layers. Electrode patterns provided in different gaps between the ceramic layers are appropriately connected to one another by via wires penetrating through the ceramic layers. The connection by the via wires can be realized across three or more layers in some cases by aligning the via wires in the thickness direction of the multilayer ceramic substrate. The via wire can be used as a thermal via in some cases such that the thermal via transfers heat produced in a semiconductor of an amplifier or the like incorporated in the multilayer ceramic substrate to the circuit board side.

In such a multilayer ceramic substrate, it has been required to form a plurality of via wires with high density within a limited area for the sake of size reduction of various electronic parts. Also, in recent years, while the wire width has been narrowing due to increase in density of the wire pattern and the like in circuit designing, it has been required to reduce the distance between a via wire and a line connected with the via wire, such as coplanar lines and ground coplanar lines, and an adjoining ground electrode.

The multilayer ceramic substrate is manufactured by stacking up ceramic green sheets in which electrodes, a pattern of wires and a via wire are formed. The via wire is formed by forming a via hole in a ceramic green sheet and filling a conductor paste into the via hole. In this process, to secure assured injection of the conductor paste into the via hole and assured connection of the via wires, the conductor paste is provided in a region which is slightly larger than the via hole and filled into the via hole so as to be higher than the opening of the via hole. Part of the conductor projecting out of the via hole is called "pad".

Patent Document 1 discloses using a via wire which has no pad for the sake of high density formation of via wires. Patent Document 2 discloses stacking up two or more ceramic green sheets and thereafter forming a via hole through the resultant multilayer structure, and filling a conductor paste into the via hole, thereby forming a via wire stacked up without forming a pad between the layers.

CITATION LIST

Patent Literature

Patent Document 1: Japanese Laid-Open Patent Publication No. H4-15991
Patent Document 2: Japanese Laid-Open Patent Publication No. H11-74645

SUMMARY OF INVENTION

Technical Problem

According to research conducted by the present inventor, it was found that the above-described conventional techniques can lead to other problems. A nonlimiting exemplary embodiment of the present application provides a multilayer ceramic substrate in which via wires can be arranged with high density and a manufacturing method thereof.

Solution to Problem

A multilayer ceramic substrate of the present disclosure includes: a plurality of ceramic layers stacked together; a via hole provided in each of the plurality of ceramic layers, the via holes of the plurality of ceramic layers being connected together in a layer stacking direction of the plurality of ceramic layers; a via wire including an electrical conductor filled into each of the via holes; a first conductor provided on an upper surface of at least one of the plurality of ceramic layers, the first conductor having an annular or partially annular shape surrounding the via wire; and a second conductor including a first portion and a second portion, the first portion being located outside the first conductor on the upper surface of the at least one ceramic layer, the second portion overlying the first conductor, and an inner rim of the second portion being located outside an inner rim of the first conductor, wherein a thickness of the first conductor is greater than a thickness of the second conductor.

Another multilayer ceramic substrate of the present disclosure includes: a sintered ceramic body; a via wire buried in the sintered ceramic body; a first conductor located on a plane generally perpendicular to a center axis of the via wire, the first conductor having an annular or partially annular shape surrounding the via wire on the plane; and a second conductor including a first portion and a second portion, the first portion being located outside the first conductor on the plane, the second portion overlying the first conductor, and an inner rim of the second portion being located outside an inner rim of the first conductor, wherein a thickness of the first conductor is greater than a thickness of the second conductor.

The second conductor may have an opening which is greater than the inner rim of the first conductor, and a rim of the opening may be located inside an outer rim of the first conductor.

The via wire may have the shape of a cylinder or a truncated cone.

The first conductor may have the shape of a circular ring.

The second portion of the second conductor may overlie the first conductor.

The second portion of the second conductor may underlie the first conductor.

A lower surface of the first conductor may be located below a lower surface of the first portion of the second conductor.

The second conductor may be a ground electrode or an inner electrode of a capacitor.

Each of the plurality of ceramic layers may include another via hole and another via wire which is formed by an electrical conductor filled into the another via hole, in the at least one ceramic layer, the another via wire may be surrounded by the first conductor, and the another via wires of the plurality of ceramic layers may be connected together.

The first multilayer ceramic substrate manufacturing method of the present disclosure includes: a first step forming a via hole in each of a plurality of ceramic green sheets; a second step of printing a conductor paste on an upper surface of each of the ceramic green sheets, thereby forming a via wire pattern in which the via hole is filled with the conductor paste and forming a first conductor pattern on an upper surface of at least one of the plurality of ceramic green sheets, the first conductor pattern having an annular or partially annular shape surrounding the via wire pattern; a third step of printing a conductor paste on an upper surface of the at least one ceramic green sheet, thereby forming a second conductor pattern which has a smaller thickness than the first conductor pattern, the second conductor pattern including a first portion and a second portion, the first portion being located outside the first conductor on the upper surface of the at least one ceramic layer, the second portion overlying the first conductor, and an inner rim of the second portion being located outside an inner rim of the first conductor; and a fourth step of stacking up the plurality of ceramic green sheets and connecting the via wire patterns.

The second multilayer ceramic substrate manufacturing method of the present disclosure includes: a first step of forming a via hole in each of a plurality of ceramic green sheets; a second step of printing a conductor paste on an upper surface of at least one of the plurality of ceramic green sheets, thereby forming a second conductor pattern surrounding the via hole on the upper surface of the at least one ceramic green sheet; a third step of printing a conductor paste on an upper surface of each of the ceramic green sheets, thereby forming a via wire pattern in which the via hole is filled with the conductor paste and forming, on an upper surface of the at least one ceramic green sheet, a first conductor pattern on part of the second conductor pattern and part of the upper surface located inside the inner rim of the second conductor pattern, the parts being located such that the inner rim of the second conductor pattern lies between the parts, the first conductor pattern having a greater thickness than that of the second conductor pattern, and the first conductor pattern having an annular or partially annular shape surrounding the via wire; and a fourth step of stacking up the plurality of ceramic green sheets and connecting the via wire patterns.

In the first or second multilayer ceramic substrate manufacturing method, the first step may include forming the via hole by laser or a punch die, and the via hole may have the shape of a cylinder or a truncated cone.

The first multilayer ceramic substrate manufacturing method may further include, between the second step and the third step, a fifth step of reducing a height of the first conductor pattern.

The fifth step may include burying part of the first conductor pattern in the ceramic green sheet from the upper surface.

In the second step of the first multilayer ceramic substrate manufacturing method, the via wire pattern and the first conductor pattern may be printed using a same mask.

In the third step of the second multilayer ceramic substrate manufacturing method, the via wire pattern and the first conductor pattern may be printed using a same mask.

Advantageous Effects of Invention

According to an embodiment of the present disclosure, a multilayer ceramic substrate in which via wires can be arranged with high density and a manufacturing method thereof are provided.

DESCRIPTION OF EMBODIMENTS

The present inventor conducted detailed research on the causes of a short circuit occurring in a conventional multilayer ceramic substrate. A manufacturing method of the conventional multilayer ceramic substrate is briefly described with reference to the drawings. FIGS. 7(a) to 7(e) are diagrams for illustrating a manufacturing method of a multilayer ceramic substrate based on a ceramic green sheet stacking method. FIGS. 7(a) to 7(e) enlargedly show a cross section of a ceramic green sheet including a via wire and illustrate the steps up to stacking of unsintered ceramic green sheets that are to be ceramic layers.

Figure 7:
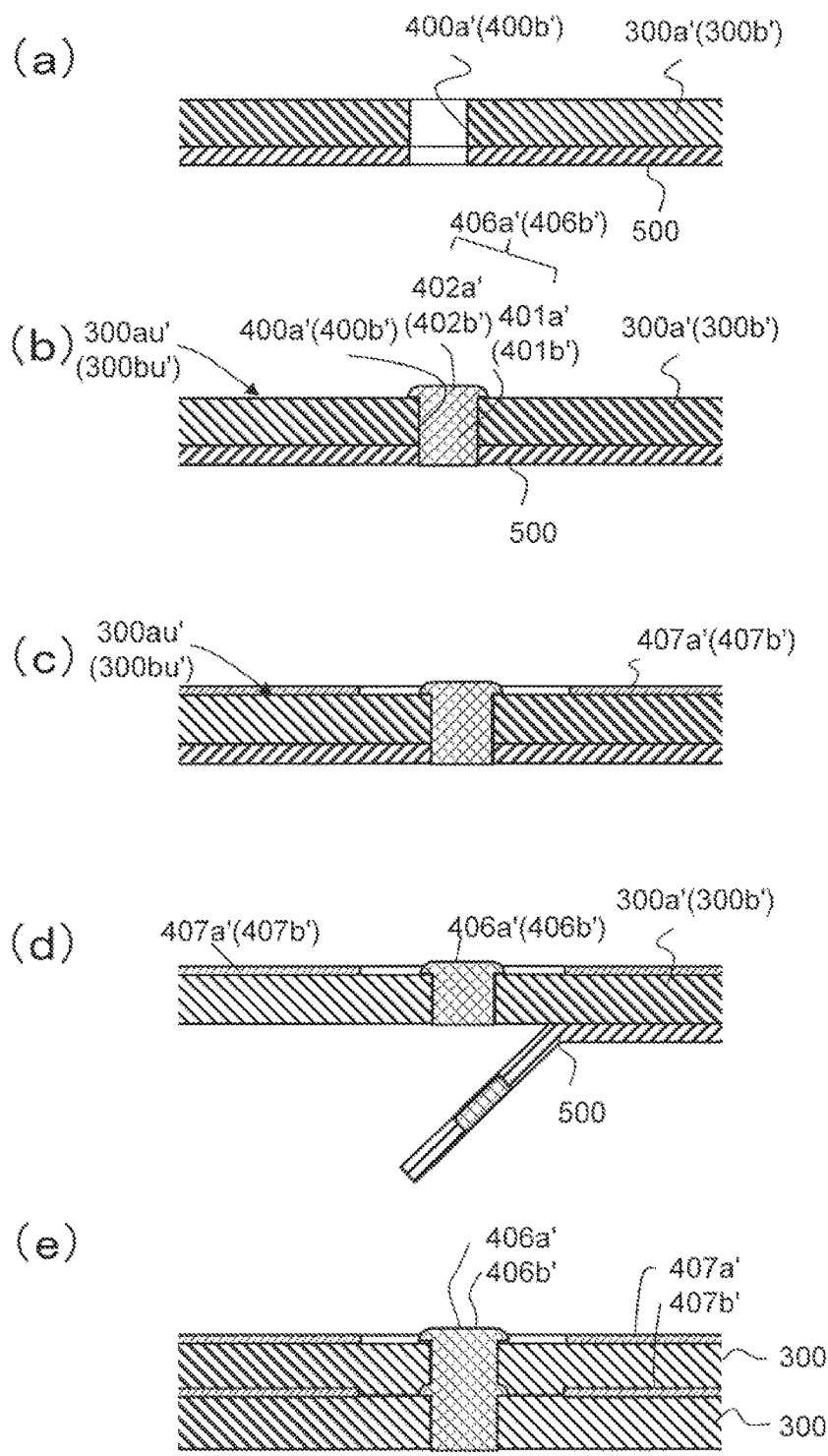
FIGS. 7(a) to 7(e) are stepwise cross-sectional views illustrating a conventional multilayer ceramic substrate manufacturing method based on a ceramic green sheet stacking method.

First, as shown in FIG. 7(a), a via hole 400a' is formed in a ceramic green sheet 300a' that is supported by the resin film 500. The ceramic green sheet 300a' is produced by a well-known method, such as doctor blade method. The via hole 400a' is punched out using a punch die or formed by laser processing.

Thereafter, a conductor paste is filled into the via hole 400a' using a printer, whereby a via wire pattern 406a', including a main part pattern 401a' and a pad pattern 402a', is formed. A mask for printing (not shown) has an opening at a position corresponding to a via hole 400a such that the opening is greater than the diameter of the via hole 400a', and therefore, after injection of the conductor paste into the via hole 400a', the pad pattern 402a' is formed on the surface of the ceramic green sheet 300a' such that the pad pattern 402a' is connected with the main part pattern 401a' and has a size corresponding to the opening as shown in FIG. 7(b).

Figure 8:
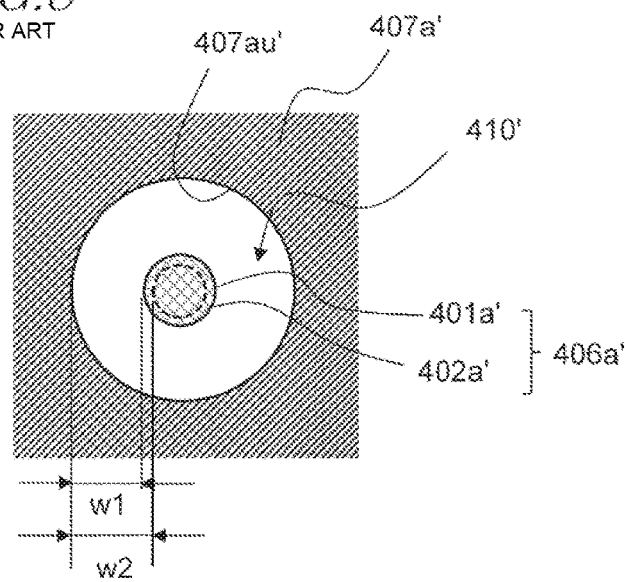
FIG. 8 is a plan view of a ceramic green sheet for use in the conventional multilayer ceramic substrate.

Then, a conductor paste is printed using a printer so as to surround the main part pattern 401a' and the pad pattern 402a', whereby an electrode pattern 407a' is formed as shown in FIG. 7(c). Here, the electrode pattern 407a' is an electrode pattern for ground or capacitor, which has no electrical connection with the main part pattern 401a' and which is a large-area pattern spreading over a single plane. FIG. 8 shows a plan view of a ceramic green sheet as an example. The electrode pattern 407a' has a circularly-bored opening 410' (see FIG. 8) in accordance with the shape of the pad pattern 402a'. Due to this opening, a predetermined gap (clearance) is secured between the main part pattern 401a' and the pad pattern 402a' of the via wire pattern 406a' and an inner rim 407au' of the electrode pattern 407a'. After the conductor paste is dried, the resin film 500 is peeled away from the ceramic green sheet 300a' as shown in FIG. 7(d).

A ceramic green sheet 300b' is produced in the same way as the ceramic green sheet 300a', which includes a via hole 400b, a main part pattern 401b' and a pad pattern 402b' which constitute a via wire pattern 406', and an electrode pattern 407b' on a surface 300bu'. The ceramic green sheets 300a', 300b' are stacked up such that the via wire patterns 406a', 406b' are aligned. The temperature is increased such that a binder contained in the ceramic green sheets 300a', 300b' softens. Pressure is applied in the layer stacking direction, whereby the ceramic green sheets are compressed together into a molded structure (multilayer structure) such as shown in FIG. 7(e). After the passage of a predetermined time period, the multilayer structure is fired, whereby a multilayer ceramic substrate is obtained in which a plurality of ceramic layers are stacked up. In the description presented herein, two ceramic green sheets constitute the multilayer ceramic substrate although, as a matter of course, three or more ceramic green sheets can constitute the multilayer ceramic substrate.

As shown in FIGS. 7(a) to 7(e), ideally, the center of the via hole 400a', 400b' is coincident with the center of the pad pattern 402a', 402b'. However, due to the flexure of the ceramic green sheet and misadjustment in position of a metal mask, a screen mask, or the like, the pad pattern 402a', 402b' is formed with positional misalignment relative to the main part pattern 401a', 401b' of the via wire 406a'. 406b' in the plane direction of the ceramic green sheet. Also, in forming the electrode pattern 407a', 407b' by printing, the electrode pattern 407a', 407b' is formed with positional misalignment in many cases. Further, there is a probability that, due to bleeding of the printed pattern, the peripheral portion of the pad pattern 402a', 402b' and the electrode pattern 407a', 407b' is disadvantageously broader than a desired dimension. Since the electrode pattern 407a', 407b' formed for ground or capacitor is formed so as to have a large area, the thickness of the electrode pattern 407a', 407b' is smaller than that of the pad pattern 402a', 402b' such that occurrence of delamination is prevented. The conductor paste for the electrode pattern 407a', 407b' is prepared so as to have a low viscosity such that it can be printed so as to have a small thickness. Accordingly, bleeding easily occurs in printing, and the amount of the bleeding has a tendency to be greater than that of the pad pattern 402a', 402b'. Therefore, the clearance needs to be determined in consideration of print misalignment and print bleeding such that the main part pattern 401a', 401b' and the pad pattern 402a', 402b' that constitute the via wire pattern 406a', 406b' have no electrical connection with the electrode pattern 407a', 407b'.

When stacking up the ceramic green sheets 300a', 300b', there is a probability that misalignment can occur between the ceramic green sheets 300a', 300b' depending on the superposition accuracy (stacking misalignment). The amount of the stacking misalignment also needs to be considered in determining the largeness of the clearance, such that a connection is not established between the via wire pattern 406a' of the ceramic green sheet 300a' and the electrode pattern 407b' of the ceramic green sheet 300b' when the sheets are superposed one on the other. Therefore, to form via wires with high density, the clearance needs to be small, and reducing the above-described positional misalignment, print bleeding, and stacking misalignment, which affects the clearance, is important.

Figure 9:
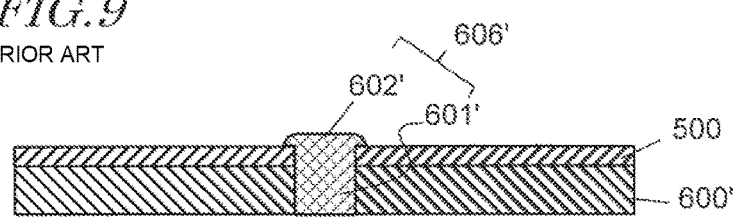
FIG. 9 is a cross-sectional view illustrating another example of the conventional multilayer ceramic substrate manufacturing method based on the ceramic green sheet stacking method.

Patent Document 1 discloses a configuration where a pad is not formed as a solution for high density formation of via wires. As shown in FIG. 9, a via hole is formed via a resin film 500 placed on the surface of a ceramic green sheet 600', and a conductor paste is filled into the via hole from the resin film 500 side, whereby a via wire pattern 606' is formed which includes a main part pattern 601' and a pad pattern 602'. After the injection, the resin film 500 is peeled away from the ceramic green sheet 600' such that the pad pattern 602' is removed together with the resin film 500. The pad pattern 602' plays a supporting role in establishing a connection between via wires. By removing the pad, the main part patterns 601' of the via wire patterns 606' can accordingly be arranged adjacently with high density.

Patent Document 2 discloses, after two or more ceramic green sheets are stacked up, forming a via hole through the resultant multilayer structure, and filling a conductor paste into the via hole, thereby forming a via wire stacked up without a pad interposed between the layers. According to this method, positional misalignment of the via holes between the stacked ceramic green sheets can be reduced.

However, when a portion corresponding to the pad is removed together with the resin film as in Patent Document 1, such a problem arises that the amount of the conductor paste disposed of and wasted accordingly increases. Although it is possible to collect and reuse a dried conductor paste adhering to the resin film, increase of the cost is unavoidable. When the resin film is removed from the ceramic green sheet, the conductor of the via wire is likely to be taken away to a pushpin-like conductor on the resin film side, and there is a probability that a recess is formed at the surface of the via wire so that it is difficult to establish a connection between the via wires. Patent Document 1 fails to disclose providing an electrode pattern such as the above-described electrode around the via wire. As a matter of course, such a problem is not recognized that stacking misalignment of the ceramic green sheets can cause a short circuit between the via wire and the electrode pattern.

When ceramic green sheets are stacked up into a multilayer structure and a via hole is formed through the multilayer structure as in Patent Document 2, formation of the via hole and injection of the conductor paste are more difficult as the number of stacked sheets increases. Further, the positional relationship between the electrode patterns formed on the inner layers of the multilayer structure cannot be confirmed, and therefore, there is a probability that due to stacking misalignment of the ceramic green sheets, a via hole is formed in a region where the electrode pattern is formed, and a short circuit occurs between the via wire and the electrode pattern.

In view of the above-described circumstances, the present inventor conceived a novel multilayer ceramic substrate in which via wires can be arranged with high density and a manufacturing method thereof. Hereinafter, an embodiment of a multilayer ceramic substrate of the present disclosure and a manufacturing method thereof are described with reference to the drawings. In the following description, the terms which designate specific directions or positions (e.g., "up", "down", "right", "left", and other terms including such terms) are also used. Such terms are used merely for clear understanding of relative directions or positions in the referred drawings. So long as the relationship of relative directions or positions designated by terms such as "up", "down", etc., in the referred drawings is identical, drawings other than those provided in the present disclosure or actual products may not have the same arrangement as that shown in the referred drawings. The size or positional relationship of components shown in the drawings is sometimes exaggerated for clear understanding. The size of a component in an actual multilayer ceramic substrate, or the relative sizes of components in the actual multilayer ceramic substrate, are sometimes not reflected in the drawings. Particularly, electrodes and electrode patterns are sometimes shown as having a greater thickness than the actual thickness for clear understanding.

Figure 1:
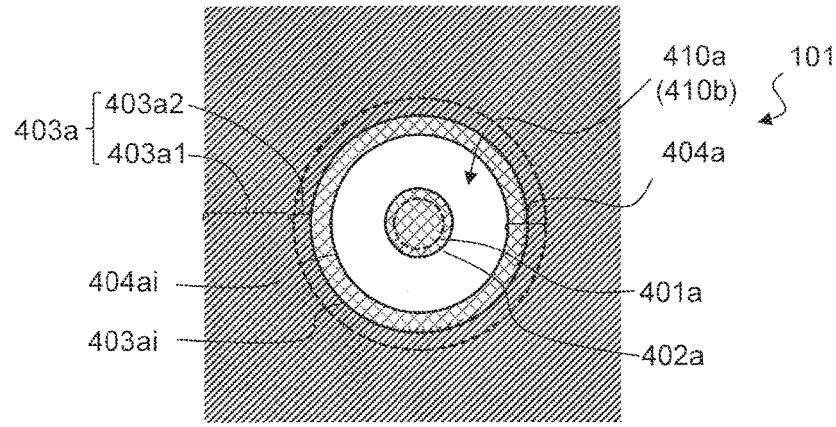
FIGS. 1(a) and 1(b) are a plan view and a cross-sectional view showing one embodiment of a multilayer ceramic substrate.
Figure 1:
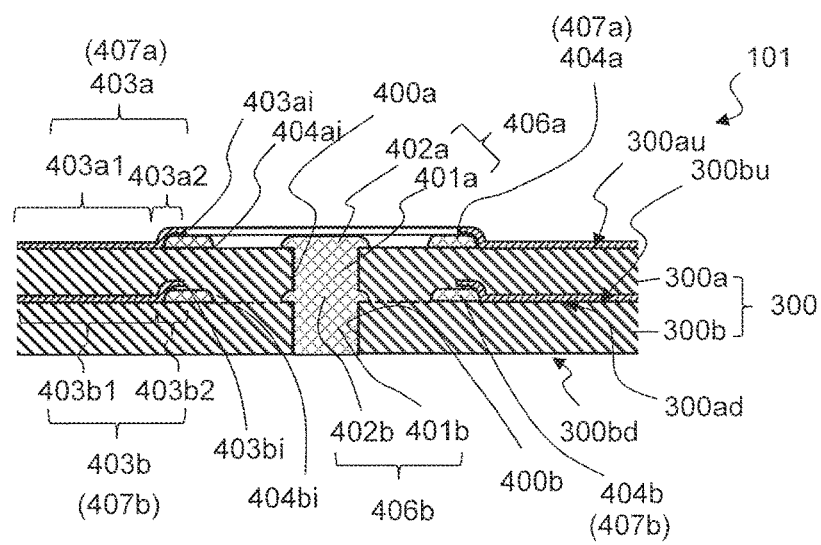
Figure 2:
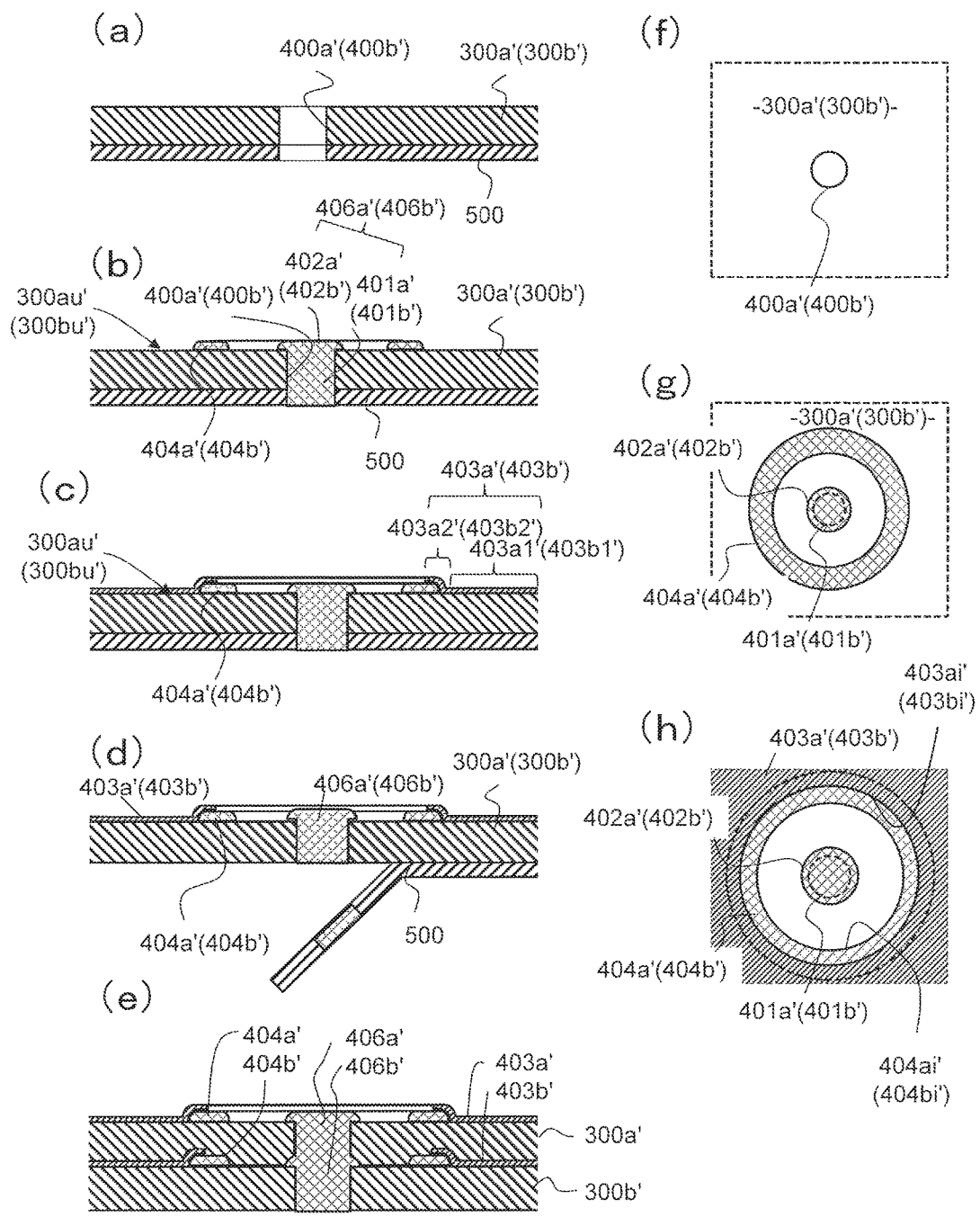
FIGS. 2(a) to 2(e) are stepwise cross-sectional views illustrating an embodiment of a manufacturing method of the multilayer ceramic substrate.
FIGS. 2(f) to 2(h) are plan views corresponding to the steps illustrated in FIGS. 2(a) to 2(c).

FIGS. 1(a) and 1(b) are a plan view and a cross-sectional view of a multilayer ceramic substrate of the present embodiment. FIG. 2 shows stepwise cross-sectional views for illustrating a manufacturing method of the multilayer ceramic substrate of the present embodiment. The multilayer ceramic substrate of the present embodiment can be manufactured through, for example, a manufacturing process of the same ceramic green sheet stacking method as that of the conventional multilayer ceramic substrate.

The multilayer ceramic substrate 101 includes ceramic layers 300a, 300b stacked together, and via holes 400a, 400b, via wires 406a, 406b, first conductors 404a, 404b and second conductors 403a, 403b, which are respectively provided in the ceramic layers 300a, 300b. In an example of the embodiment described in the following section, the multilayer ceramic substrate 100 includes the ceramic layers 300a, 300b which are formed by stacking up two green sheets and sintering the stacked green sheets, although the multilayer ceramic substrate 101 may be formed by three or more green sheets.

The following description will be focused on the structure in the vicinity of the via wires 406a, 406b, which is one of the features of the multilayer ceramic substrate 101 of the present embodiment, although the multilayer ceramic substrate 101 of the present embodiment may include various other components, such as various passive components including capacitors, resistances, inductors, etc., which are realized by other electrodes, wirings, via wires, etc., wirings that establish connections between these passive components, pads that connect active components, and electrical conductors for radiation of heat.

The ceramic layers 300a, 300b constitute a sintered ceramic body 300. As previously described, the sintered ceramic body 300 of the present embodiment includes the ceramic layers 300a, 300b corresponding to two ceramic green sheets, although a common sintered ceramic body includes two to several tens of ceramic layers. The sintered ceramic body 300 may include a ceramic layer in which the via holes 400a, 400b and the via wires 406a, 406b are not provided. A plurality of ceramic layers included in the sintered ceramic body 300 may not have a definite border in some cases. In such a case, the border between two ceramic layers that sandwich an electrode may be defined based on the position of the bottom surface of the electrode formed on the upper surface of the ceramic green sheet.

The ceramic layers 300a, 300b have via holes 400a, 400b, respectively. The via holes 400a, 400b are connected together in the layer stacking direction of the plurality of ceramic layers 300a, 300b. The layer stacking direction is perpendicular to the upper surfaces of the ceramic layers 300a, 300b. One of the openings of the via hole 400a, 400b at the upper surface 300au, 300bu of the ceramic layer 300a, 300b and the other opening at the lower surface 300ad, 300bd may have the same size or may have different sizes. That is, the via hole 400a, 400b may have the shape of a pole or may have the shape of a truncated pyramid (frustum). The openings may be circular or may be polygonal. The ceramic layers 300a, 300b may have a plurality of via holes. In such a case, at least one via hole only needs to have the configuration of the present embodiment, while the other via holes do not need to have the configuration of the present embodiment.

The via wires 406a, 406b are buried in the sintered ceramic body 300 and include at least main parts 401a, 401b which are made of an electrical conductor filled into the via holes 400a, 400b. In the present embodiment, the via wires 406a, 406b further include pads 402a, 402b. The pads 402a, 402b are also made of the electrical conductor. That is, the via wires 406a, 406b are electrical conductors. The pads 402a, 402b are present at the upper surfaces 300au, 300bu of the ceramic layers 300a, 300b, respectively, and are connected with the main parts 401a, 401b, respectively. In a top view of the ceramic layer 300a, 300b, the diameter of the pad 402a, 402b may be greater than or equal to that of the via hole 400a, 400b. That is, the pad 402a, 402b may not have a flange. Also, the via wire 406a, 406b may not have the pad 402a, 402b.

The shape of the main part 401a, 401b of the via wire 406a, 406b reflects the shape of the via hole 400a, 400b. That is, the main part 401a, 401b of the via wire 406a, 406b may have the shape of a pole or may have the shape of a truncated pyramid (frustum). Specifically, the main part 401a, 401b may have the shape of a cylinder or a truncated cone (conical frustum).

The pads 402a, 402b are provided for more assured injection of the conductor paste into the via holes of the ceramic green sheets in manufacture of the multilayer ceramic substrate 101. In stacking up the ceramic green sheets, connection between the conductor pastes filled into the via holes is more assuredly established while positional misalignment is allowed.

The first conductor 404a, 404b is present on the upper surface 300au, 300bu of the ceramic layer 300a, 300b and has an annular (ring) shape or a partially annular (partial ring) shape surrounding the via wire 406a, 406b. The "annular" shape means that the first conductor has no discontinuity and surrounds the via wire 406a, 406b on the upper surface 300au, 300bu. The "partially annular" shape means that the first conductor surrounds the via wire 406a, 406b on the upper surface 300au, 300bu but has a discontinuity. The annular and partially annular shapes may be circular or may have a polygonal or non-polygonal shape. When the border between the ceramic layers 300a, 300b is indefinite, the first conductor 404a, 404b can be defined as being present on a plane generally perpendicular to the center axis of the via wire 406a, 406b. The term "generally perpendicular" means that it is within the angular range of, for example, 90°±10°.

The second conductor 403a, 403b includes a first portion 403a1, 403b1 and a second portion 403a2, 403b2. The first portion 403a1, 403b1 is located outside the first conductor 404a, 404b on the upper surface 300au, 300bu of the ceramic layer 300a, 300b or on the previously-defined plane. The second portion 403a2, 403b2 overlies the first conductor 404a, 404b. The inner rim 403ai, 403bi of the second portion 403a2, 403b2 is located outside the inner rim 404ai, 404bi of the first conductor 404a, 404b. The inner rim 403ai, 403bi defines the opening 410a, 410b of the second conductor 403a, 403b. In other words, the second conductor 403a, 403b has the opening 410a, 410b that is greater than the inner rim 404ai, 404bi of the first conductor 404a, 404b. The inner rim 403ai, 403bi of the opening 410a, 410b is located inside the outer rim of the first conductor 404a, 404b.

The second conductor 403a, 403b is a conductor layer which has a larger area than the wire. The thickness of the second conductor 403a, 403b is smaller than that of the first conductor 404a, 404b. In other words, the thickness of the first conductor 404a, 404b is greater than that of the second conductor 403a, 403b.

The second conductors 403a, 403b constitute electrodes 407a, 407b, which are equivalent to ground electrodes, shield electrodes, inner electrodes of capacitors, etc., in a conventional multilayer ceramic substrate. The second conductors 403a, 403b are also referred to as "solid electrodes". The electrodes 407a, 407b of the present embodiment are respectively provided on the upper surfaces 300au, 300bu of the ceramic layers 300a, 300b, but only need to be provided on the upper surface of at least one of the plurality of ceramic layers. Further, particularly, the second portions 403a2, 403b2 of the second conductors 403a, 403b may have the same shape or may have different shapes.

The ceramic layers 300a, 300b, the via wires 406a, 406b, the first conductors 404a, 404b and the second conductors 403a, 403b are formed using common materials which are commonly used in multilayer ceramic substrates, such as LTCC substrates or HTCC substrates. The material of the second conductors 403a, 403b may be the same as, or different from, the material of the first conductors 404a, 404b.

As previously described, examples of the factors that inhibit high density arrangement of via wires in a conventional multilayer ceramic substrate include stacking misalignment, print misalignment, and print bleeding. Hereinafter, this point is further described. Table 1 shows combinations of stacking misalignment between the ceramic green sheets which is caused by the ceramic green sheet stacking method, print misalignment of pads and electrodes, and symbols indicative of the maximum amount of print bleeding. The amounts of misalignment shown below represent the values obtained when viewed in the layer stacking direction of the ceramic layers, i.e., in a top view.

TABLE 1

| FACTOR | | MAXIMUM AMOUNT |
|---|---|---|
| STACKING MISALIGNMENT OF GREEN SHEETS | | Sz |
| PAD | PRINT MISALIGNMENT | Pz |
| | PRINT BLEEDING | Pn |
| ELECTRODE | PRINT MISALIGNMENT | Rz |
| | PRINT BLEEDING | Rn |

The stacking misalignment of ceramic green sheets refers to the amount of misalignment between the centers of via holes of adjoining ceramic green sheets which are to be connected together, and is defined where Sz is the maximum amount of the misalignment which can occur during the process. The center of the via hole is coincident with the center of the via wire.

The print misalignment of a pad refers to the amount of misalignment between the centers of a via hole and a pad which are to be superposed one on the other, and is defined where Pz is the maximum amount of the misalignment which can occur during the process. The print misalignment of an electrode refers to the amount of misalignment between the center of a via hole and the center of an opening which is formed in the electrode so as not to overlap the via hole, and is defined where Rz is the maximum amount of the misalignment which can occur during the process.

Figure 10:
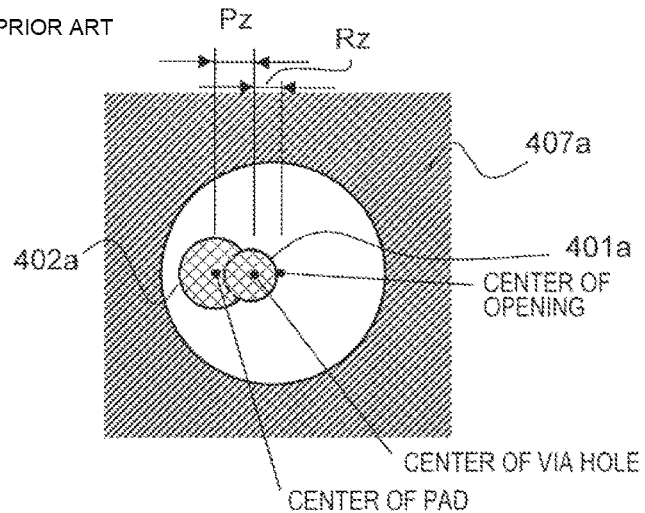
FIG. 10 is a plan view of a ceramic green sheet for use in a multilayer ceramic substrate, for illustrating print misalignment of a pad and an electrode.

FIG. 10 is a plan view of a ceramic green sheet for use in a multilayer ceramic substrate, for illustrating print misalignment of a pad and an electrode. In the illustrated example, relative to the center of the via hole, the center of the pad 402a is misaligned by −Pz in the illustrated x direction, and the center of the opening of the electrode 407a is misaligned by +Rz. FIG. 10 shows that the main part 401a of the via wire lying under the pad 402a is partially exposed at the surface due to print misalignment of the pad 402a. The via hole, the pad and the electrode have a circular shape in a top view because of their excellent shapeability. Thus, in the following description, the shape of each of these components in a top view is assumed as circular.

Figure 11:
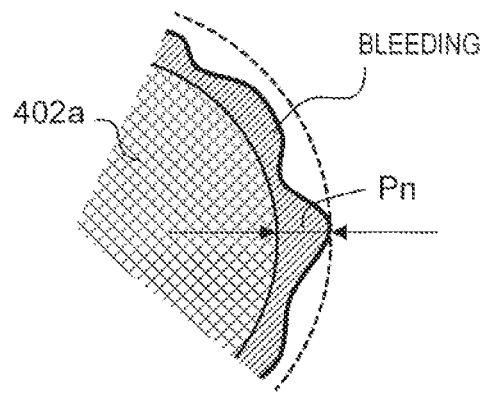
FIG. 11 is a plan view for illustrating print bleeding which can be caused by printing of a conductor paste used in the ceramic green sheet stacking method.

The definition of print bleeding is described with reference to FIG. 11. In a mask used in screen printing, mesh spaces corresponding to the patterns of pads and electrodes to be formed on a ceramic green sheet that is an object of printing are closed by appropriately filling an emulsion into the spaces. Alternatively, a metal mask realized by forming openings corresponding to the patterns in a thin stainless steel plate may also be used. For example, in formation of the pad 402a by printing, the outer rim of the pad 402a is ideally coincident with the rim of ones of the mesh spaces of the screen mask which are not filled with the emulsion (mask openings) or the rim of the opening of the metal mask. In view of such, the print bleeding refers to a portion protruding beyond the outer rim of the pad 402a which is determined by the mask openings of the screen mask, and is defined where Pn is the maximum amount of the print bleeding which can occur during the process. The inner rim of the electrode is coincident with the rim of ones of the mesh spaces of the screen mask which are filled with the emulsion (mask closed portions), corresponding to the opening formed in the electrode. In view of such, the print bleeding refers to a portion protruding beyond the inner rim of the opening of the electrode which is determined by the mask closed portions of the screen mask, and is defined where Rn is the maximum amount of the print bleeding which can occur during the process.

In the ceramic green sheet stacking method, it has been known that, as for stacking misalignment, print misalignment and print bleeding which can occur during the process, in general, the stacking misalignment Sz is likely to be greater than the print misalignment Pz, Rz (Sz>Pz, Sz>Rz), and the print misalignment Pz of the pad is generally equal to the print misalignment Rz of the electrode (Pz≈Rz). Also, the print bleeding Rn of the electrode that is thin as compared with the pad is likely to be greater than the print bleeding Pn of the pad (Rn>Pn). This is because, as previously described, a conductor paste used for formation of a thin electrode has a smaller viscosity than a conductor paste used for formation of a thick electrode.

As shown in FIG. 8, in a conventional ceramic green sheet multilayer structure, the rim of the pad 402a' and the inner rim 407au' of the electrode 407a' cannot be electrically separated from each other without setting the interval w1 between the rim of the pad 402a' and the inner rim 407au' of the electrode 407a' greater than the total amount of their print misalignment and print bleeding (w1>Pz+Pn+Rz+Rn). Thus, the external dimensions of the pad 402a' are preferably as small as possible. More preferably, the outer rim of the pad is coincident with the outer rim of the via hole. As the external dimensions of the pad 402a' are reduced for the purpose of high density arrangement of a plurality of via wires 406a', the main part pattern 401a' of the via wire pattern 406a is more likely to be exposed at the surface of the ceramic green sheet due to print misalignment of the pad 402a', and there is a probability that the via wire connecting function which can be achieved by the pad 402a' is not expected. In view of such, in order that that via wires can be connected with each other, the diameter D of the main part pattern of the via wire pattern, which is determined by the diameter of the via hole, needs to be greater than the stacking misalignment Sz (D>Sz).

Here, the via wires preferably have the shape of a cylinder or a truncated cone. In the case where the via wires have the shape of a truncated cone, the requirement for connection of adjoining via wires is that, when the smaller diameter side of a via wire (diameter Ds) and the larger diameter side of an adjoining via wire (diameter Dl) are connected, ½ of the sum of the diameter on the smaller diameter side, Ds, and the diameter on the larger diameter side, Dl, is greater than the stacking misalignment Sz ((Ds+Dl)/2>Sz). When the smaller diameter side of a via wire (diameter Ds) and the smaller diameter side of an adjoining via wire (diameter Ds) are connected, the diameter on the smaller diameter side, Ds, is required to be greater than the stacking misalignment Sz (Ds>Sz). When the larger diameter side of a via wire (diameter Dl) and the larger diameter side of an adjoining via wire (diameter Dl) are connected, the diameter on the larger diameter side, Dl, is required to be greater than the stacking misalignment Sz (Dl>Sz). In the following description, it is assumed that the via wires have the shape of a cylinder for the sake of simplicity in description.

Figure 12:
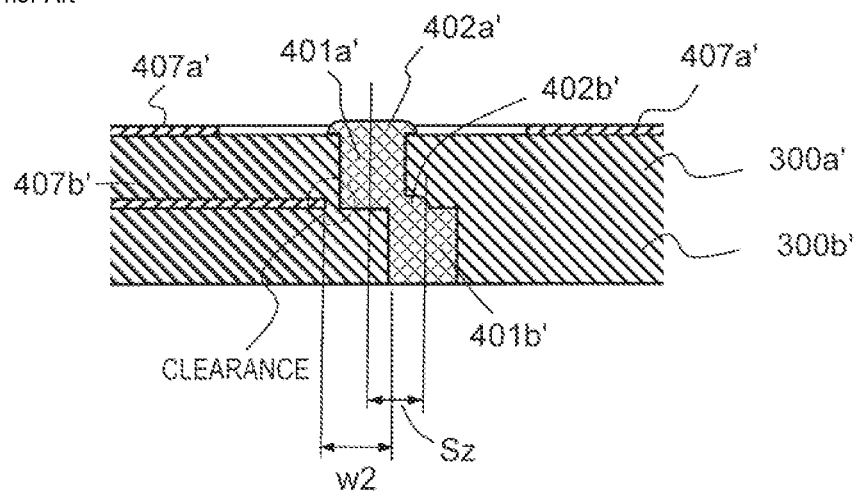
FIG. 12 is a cross-sectional view for illustrating the state of stacked ceramic green sheets of a conventional multilayer ceramic substrate.

FIG. 12 is a cross-sectional view of a conventional multilayer structure where used ceramic green sheets have stacking misalignment and print misalignment in a pad and an electrode. As shown, in order that a gap is always provided between the main part pattern 401a' of the via wire pattern formed on the ceramic green sheet 300a' and the electrode 407b' formed on the green sheet 300b' such that a short circuit would not occur, the gap w2 between the outer rim of the main part pattern 401b' of the via wire pattern and the inner rim of the electrode 407b' needs to be greater than the total amount of the stacking misalignment Sz and the print misalignment Rz and the print bleeding Rn of the electrode 407b' (w2>Sz+Rz+Rn). The requirement for electrical separation of the rim of the pad 402b' from the inner rim of the electrode 407b' is as previously described with reference to FIG. 8.

Thus, under the above-described precondition, a short circuit does not occur between a pad and an electrode formed on the same ceramic green sheet and a short circuit does not occur between a via wire and an electrode formed on different ceramic green sheets simply when the configuration is designed such that the following conditions are met:

w1>Pz+Pn+Rz+Rn w2>Sz+Rz+Rn w1≤w2 where w1 is the interval between the rim of the pad and the rim of the electrode, w2 is the interval between the outer rim of the via wire and the inner rim of the electrode, Sz is the stacking misalignment of ceramic green sheets, Pz is the print misalignment of the pad, Pn is the print bleeding of the pad, Rz is the print misalignment of the electrode, and Rn is the print bleeding of the electrode.

The present inventor wholeheartedly carried out extensive researches on high density arrangement of via wires in a multilayer ceramic substrate and, in view of such basic conditions for configuration designing, reached a fact that the print bleeding of the electrode is larger than that of the pad although the print misalignment of the electrode is equivalent to that of the pad. When the electrode has a large thickness, preferably when the thickness of the electrode is generally equal to that of the pad, conductor pastes which have generally equal viscosities can be used, and the print bleeding Rn of the electrode can be reduced to the degree of the print bleeding Pn of the pad.

When the thickness of the electrode is increased, the electrode and the pad can be formed together by printing. In this case, print misalignment does not occur between the electrode and the pad, and a constant interval w1 is always secured. Therefore, the interval w1 only needs to be determined in consideration of the print bleeding Pn of the pad and the print bleeding Rn of the electrode. That is, it is only necessary to meet the condition of w1>Pz+Rz.

However, when the thickness of the electrode is increased, delamination of the ceramic layers is likely to occur. In view of such circumstances, the present inventor found that, when a neighboring portion surrounding the via wire of the electrode is formed so as to have a greater thickness while the other portions are formed so as to have a relatively small thickness such that the pad has a greater thickness in the resultant structure, the interval w1 between the rim of the pad and the rim of the electrode and the interval w2 between the outer rim of the via wire and the inner rim of the electrode can be reduced by Rn−Pn (Rn is the print bleeding of the electrode, and Pn is the print bleeding of the pad) while occurrence of delamination is prevented, and by the decrease of the intervals w1, w2, the via wires can be arranged with higher density accordingly.

Next, a manufacturing method of the multilayer ceramic substrate that has the above-described configuration is described. As shown in FIGS. 2(a) and 2(f), a ceramic green sheet 300a' having a thickness of, for example, 20-200 μm and supported by a resin film 500 such as PET (polyethylene terephthalate) is prepared (first step). By baking, the ceramic green sheets 300a', 300b' are changed into ceramic layers 300a, 300b which constitute a multilayer ceramic substrate. The ceramic green sheets 300a', 300b' are formed by a known sheet molding method such as a doctor blade method using, for example, a ceramic material which can be sintered at low temperatures (LTCC: Low Temperature Co-fired Ceramics). Examples of the material that forms the ceramic layers include celsian ceramic materials, cordierite ceramic materials, alumina-cordierite ceramic materials, and alumina-anorthite ceramic materials. The ceramic green sheets 300a', 300b' can be realized by, for example, molding a slurry into the shape of a sheet, the slurry being prepared by dispersing powder of an oxide of an element which is a constituent of the above-described ceramic material in an organic binder containing a polyvinyl butyral resin or in a plasticizer such as dibutylphthalate. Alternatively, the ceramic green sheets 300a', 300b' may be produced using a slurry which is prepared by adding an organic binder or plasticizer to pulverized powder obtained by mixing, calcining and pulverizing oxide powder and glass powder.

The ceramic green sheets 300a', 300b' have via holes 400a', 400b'. In formation of the via holes 400a', 400b', for example, a punch die may be used which has a plurality of punch pins. When the diameter and position of the via hole are different among the ceramic layers 300a', 300b', the via holes 400a', 400b' may be formed by laser processing. The via holes 400a', 400b' formed by laser processing may have the shape of a cylinder depending on the laser output intensity. The via holes 400a', 400b' may have the shape of a truncated cone. When formed by a punch die, the via hole usually has a cylindrical shape. In FIG. 2(a), the resin film 500 also has a through hole corresponding to the via hole 400a', 400b', although the resin film 500 may not have a through hole. Alternatively, the resin film 500 may have a recess corresponding to the via hole 400a', 400b'.

Then, the ceramic green sheet 300a', 300b' and the screen mask are set in a printer, and a conductor paste is filled into the via hole 400a', 400b' of the ceramic green sheet 300a', 300b' by printing using a squeegee, whereby the main part pattern 401a', 401b' of the via wire 406a', 406b' is formed as shown in FIGS. 2(b) and 2(g). On the upper surface 300au', 300bu' of the ceramic green sheet 300a', 300b', a pad pattern 402a', 402b' connecting to the main part pattern 401a', 401b' and a first conductor pattern 404a', 404b' surrounding the pad pattern 402a', 402b' are formed (second step). The conductor paste used can be a known conductor paste prepared by dispersing an electrical conductor in a resin or the like, such as, for example, a silver paste, a copper paste, a silver-palladium paste, or the like. In FIG. 2(b), the through hole of the resin film 500 is also filled with the conductor paste, although the through hole of the resin film 500 does not need to be filled with the conductor paste. The main part pattern 401a', 401b' and the pad pattern 402a', 402b' constitute the via wire pattern 406a', 406b'.

The screen mask has openings which define the pad pattern 402a', 402b' and the first conductor pattern 404a', 404b'. Therefore, by performing screen printing only once, formation of the pad pattern 402a', 402b' and formation of the first conductor pattern 404a', 404b' can be simultaneously accomplished. The first conductor pattern 404a', 404b' is located around the pad pattern 402a', 402b' with a predetermined clearance therebetween. Since the pad pattern 402a', 402b' and the first conductor pattern 404a', 404b' are formed through a single printing procedure, positional misalignment of the pad pattern 402a', 402b' relative to the first conductor pattern 404a', 404b' would not occur. The first conductor pattern 404a', 404b' and the pad pattern 402a', 402b' are formed so as to have generally equal thicknesses. In forming a predetermined electrode pattern by screen printing, if the thickness of the printed electrode pattern is large, the edge portions of the electrode pattern are definitely formed so that print bleeding can be reduced. It is preferred that the thicknesses of the first conductor pattern 404a', 404b' and the pad pattern 402a', 402b' as printed are not less than 14 µm.

Next, the screen mask is replaced by another one, and a conductor paste is printed on the upper surface 300au', 300bu' of the ceramic green sheet 300a', 300b' using a squeegee such that a second conductor pattern 403a', 403b' is formed as shown in FIGS. 2(c) and 2(h) (third step). The second conductor pattern 403a', 403b' includes a first portion 403a1', 403b1' located outside the first conductor pattern 404a', 404b' on the upper surface 300au', 300bu' and a second portion 403a2', 403b2' overlying the first conductor pattern 404a', 404b'. The second portion 403a2', 403b2' is located on the first conductor pattern 404a', 404b'. The inner rim 403ai', 403bi' of the second portion 403a2', 403b2' is located outside the inner rim 404ai', 404bi' of the first conductor pattern 404a', 404b'.

The second conductor pattern 403a', 403b' can also be formed using a known conductor paste, such as a silver paste, a copper paste, a silver-palladium paste, or the like.

The thickness of the second conductor pattern 403a', 403b' is smaller than that of the first conductor pattern 404a', 404b'. For example, the thickness of the second conductor pattern 403a', 403b' is not more than 10 µm. Wirings such as an electrode pattern for a capacitor and other conductor patterns for passive components may be formed simultaneously with the second conductor pattern 403a', 403b'.

As shown in FIG. 2(d), the resin film 500 is peeled away from the ceramic green sheet 300a, 300b on which the main part pattern 401a', 401b' and the pad pattern 402a', 402b' that constitute the via wire pattern 406a', 406b', the second conductor pattern 403a', 403b', and the first conductor pattern 404a', 404b' have been formed. Note that the resin film may be peeled away after the ceramic green sheets are stacked up and bonded together by compression.

As shown in FIG. 2(e), a plurality of ceramic green sheets 300a', 300b' are stacked up, and via wire patterns are connected together between the different ceramic green sheets (fourth step). The ceramic green sheet 300b' is fixed to a press machine using an adhesive sheet, and the ceramic green sheets 300a', 300b' are arranged such that the via wire patterns 406a', 406b' are aligned together, and pressure is applied on the ceramic green sheets 300a', 300b' in a vertical direction. In this step, the pressure of 1-10 MPa is kept applied for 10-100 seconds at a temperature at which the binder softens, for example 30-90° C. Thereby, the ceramic green sheets 300a', 300b' are bonded together by compression, resulting in a green sheet multilayer structure. By decreasing the thickness of the second conductor patterns 403a', 403b', the adhesion between the layers can be improved in stacking up the ceramic green sheets 300a', 300b', and occurrence of delamination can be prevented even when the multilayer structure is produced with a low compression force. As the compression force applied in stacking of the sheets decreases, stacking misalignment and deformation of the ceramic green sheets 300a', 300b' decrease, so that breakage of the ceramic green sheets 300a', 300b' and disconnection of the via wire patterns 406a', 406b' can be prevented.

Thereafter, the above-described multilayer structure is fired (sintering step). This baking is performed in, for example, air or a $N_2$ atmosphere at 800° C. to 1000° C. for the duration of about 30 minutes to 10 hours, although these parameters depend on the type of the conductor paste. Thereby, a sintered ceramic body is formed from the green sheet multilayer structure. Meanwhile, the main part pattern and the pad pattern, which are made of the conductor paste, constitute the via wire of the electrical conductor. Further, the first conductor and the second conductor are formed from the first conductor pattern and the second conductor pattern which are made of the conductor paste. Thus, the multilayer ceramic substrate 101 shown in FIG. 1 is obtained.

As an example, the maximum values of the stacking misalignment Sz, the print misalignment Pz and the print bleeding Pn of the pad, the print misalignment Qz and the print bleeding Qn of the first conductor, the print misalignment Rz' and the print bleeding Rn' of the second conductor, which are reached during the process, are shown in Table 2.

Since the multilayer structure is manufactured by the above-described ceramic green sheet stacking method which is the same as the conventional method, the maximum values of the stacking misalignment Sz and the print misalignment Pz and the print bleeding Pn of the pad in the present embodiment are equal to those of the conventional method, and the print misalignment Rz' and the print bleeding Rn' of the second conductor are equal to the print misalignment Rz and the print bleeding Rn of the conventional electrode. The print misalignment Qz of the first conductor is equal to the print misalignment of the pad and the second conductor. The print bleeding Qn of the first conductor is smaller than the print bleeding Rn' of the second conductor. In Table 2, the value of the print bleeding Qn is on the assumption that the thickness of the first conductor is equal to that of the pad.

When the thickness of the first conductor is generally equal to that of the pad, the print bleeding of the first conductor can also be generally equal to that of the pad. Therefore, the interval w1 between the rim of the pad and the rim of the electrode and the interval w2 between the outer rim of the via wire and the inner rim of the electrode can be reduced by the difference between the print bleeding Rn of the electrode and the print bleeding Qn of the first conductor as compared with the conventional multilayer structure.

TABLE 2

| FACTOR | | MAXIMUM AMOUNT |
|---|---|---|
| STACKING MISALIGNMENT OF GREEN SHEETS | | Sz (50 μm) |
| PAD | PRINT MISALIGNMENT | Pz (25 μm) |
| | PRINT BLEEDING | Pn (5 μm) |
| FIRST CONDUCTOR | PRINT MISALIGNMENT | Qz (25 μm) |
| | PRINT BLEEDING | Qn (5 μm) |
| SECOND CONDUCTOR | PRINT MISALIGNMENT | Rz, Rz' (25 μm) |
| | PRINT BLEEDING | Rn, Rn' (15 μm) |

Specifically, the interval w1 between the rim of the pad 402a, 402b and the rim of the electrode 407a, 407b (first conductor 404a, 404b) is 60 μm (Pz+Pn+Qz+Qn), while the interval w1 in the conventional multilayer structure is 70 μm (Pz+Pn+Rz+Rn). The interval w2 is 80 μm (Sz+Qz+Qn), while the interval w2 in the conventional multilayer structure is 90 μm (Sz+Rz+Rn). That is, each of w1 and w2 can be reduced by 10 μm. Thus, the first conductor 404a, 404b that is to be electrically coupled with the second conductor 403a, 403b can be formed near the via wire 406a, 406b, and therefore, the interval between adjoining via wires 406a, 406b can also be reduced so that a relatively high density arrangement is possible.

According to such a multilayer ceramic substrate of the present embodiment, an electrode, such as a ground electrode formed around a via wire, a shield electrode, an inner electrode for a capacitor, etc., is formed by the first conductor that has an annular or partially annular shape surrounding the via wire and the second conductor that overlaps the first conductor but is not present inside the first conductor and that extends outside the first conductor. The thickness of the first conductor is greater than that of the second conductor. As the thickness of the conductors increases, the viscosity of a conductor paste used for formation of the conductors can be increased. Therefore, in forming a pattern of the electrode on a green sheet by printing, the print bleeding of the pattern of the electrode at the opening on the via wire side can be reduced. Thus, the clearance between the via wire and the electrode can be reduced, and the via wires can be arranged with higher density.

Figure 3:
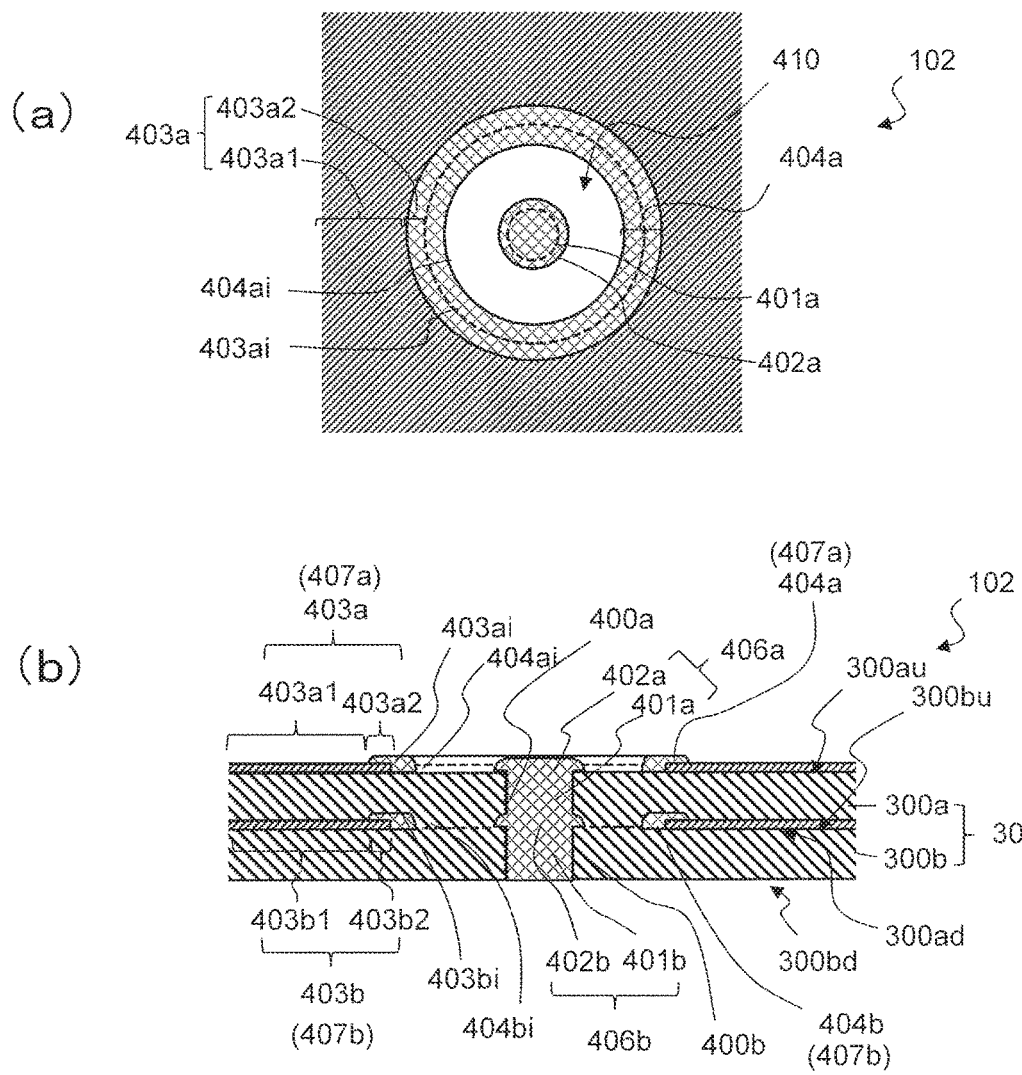
FIGS. 3(a) and 3(b) are a plan view and a cross-sectional view showing another embodiment of the multilayer ceramic substrate.

Various modifications can be made to the multilayer ceramic substrate and the manufacturing method of the multilayer ceramic substrate of the present embodiment. FIG. 3 shows an alternative configuration of the multilayer ceramic substrate of the present disclosure. FIGS. 3(a) and 3(b) are a plan view and a cross-sectional view of a multilayer ceramic substrate 102. In the multilayer ceramic substrate 102, the second portion 403a2, 403b2 of the second conductor 403a, 403b is present under the first conductor 404a, 404b. In FIG. 3 and subsequent drawings showing still alternative configurations, the first conductors and the second conductors formed in two ceramic layers have the same shape, although the first conductors and the second conductors formed in two ceramic layers may have different shapes as illustrated in the above-described embodiment. In the multilayer ceramic substrate 102, it is only necessary that the first conductor and the second conductor are formed on at least one ceramic layer. In FIG. 3, parts which are equivalent to those of FIG. 1 are designated by the same reference numerals as those used in FIG. 1.

The multilayer ceramic substrate 102 can be manufactured by, for example, the following method. Firstly, a via hole is formed in each of a plurality of ceramic green sheets (first step). Thereafter, a conductor paste is printed on the upper surface of each ceramic green sheet such that a second conductor pattern surrounding the via hole is formed on the upper surface of each ceramic green sheet (second step).

Then, a conductor paste is printed on the upper surface of each ceramic green sheet so as to form a via wire pattern in which the via hole is filled with the conductor paste and a first conductor pattern on part of the second conductor pattern and part of the upper surface located inside the inner rim of the second conductor pattern, the parts being located such that the inner rim of the second conductor pattern lies between the parts, the first conductor pattern having a greater thickness than that of the second conductor pattern, and the first conductor pattern having an annular or partially annular shape surrounding the via wire (third step).

Thereafter, a plurality of ceramic green sheets are stacked up, and the via wire patterns are connected together, whereby a multilayer structure is obtained (fourth step). Lastly, the multilayer structure is sintered, whereby a multilayer ceramic substrate is obtained. Such a manufacturing method can also likewise achieve the effect of increasing the arrangement density of the via wires.

Figure 4:
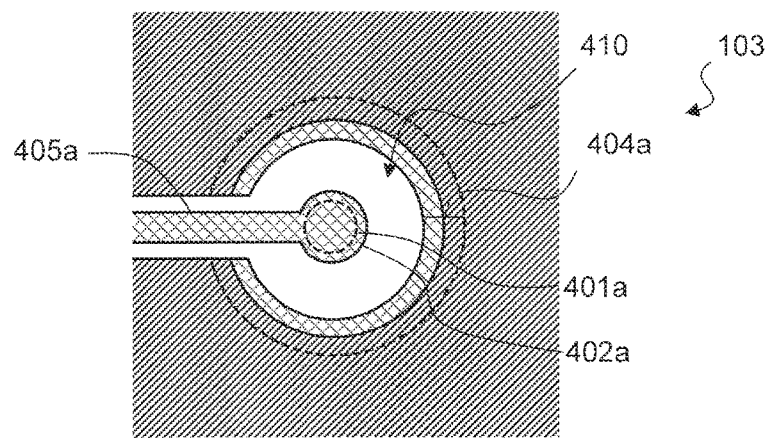
FIGS. 4(a) and 4(b) are a plan view and a cross-sectional view showing still another embodiment of the multilayer ceramic substrate.
Figure 4:
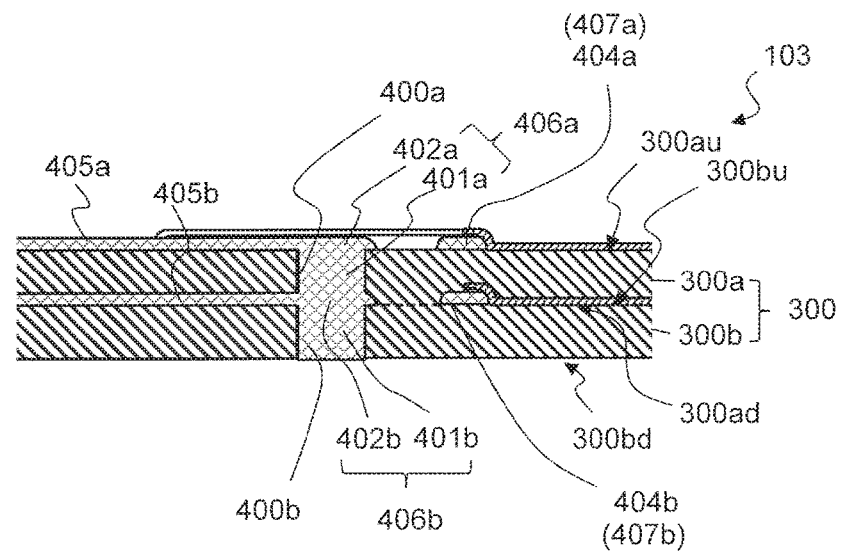

FIG. 4 shows still another embodiment of the multilayer ceramic substrate of the present disclosure. FIGS. 4(a) and 4(b) are a plan view and a cross-sectional view of a multilayer ceramic substrate 103. The multilayer ceramic substrate 103 include a third conductor 405a, 405b on the upper surface 300au, 300bu of the ceramic layer 300a, 300b, the third conductor 405a, 405b being connected with the pad 402a, 402b. The third conductor 405a, 405b is in the form of a strap and is a wire which serves as a signal line or power line, an electrode that forms an inductance, or the like. On the upper surface 300au, 300bu of the ceramic layer 300a, 300b, the electrode 407a, 407b that functions as a ground electrode or shield electrode is arranged exclusive of the region of the third conductor 405a, 405b and is spaced away from the third conductor 405a, 405b with a predetermined clearance therebetween. Therefore, the shape of the first conductor 404a is not entirely but partially annular. Specifically, the first conductor 404a has a C-shape. Such a configuration can also likewise achieve the effect of increasing the arrangement density of the via wires. In FIG. 4, parts which are equivalent to those of FIG. 1 are designated by the same reference numerals as those used in FIG. 1.

Figure 5:
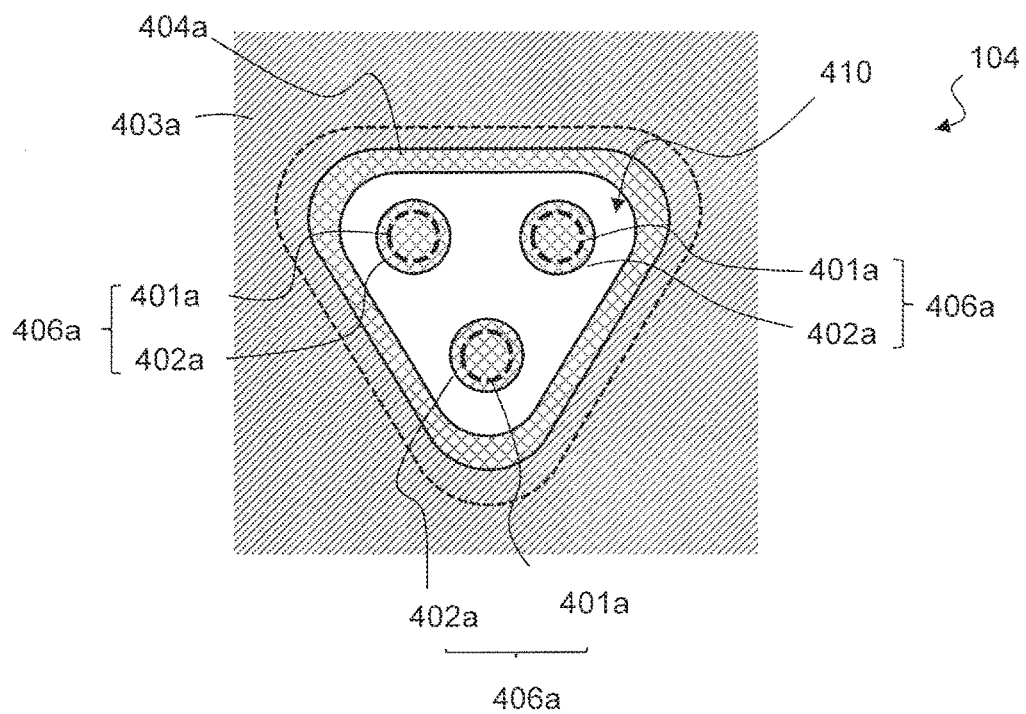
FIG. 5 is a plan view showing still another embodiment of the multilayer ceramic substrate.

FIG. 5 is a plan view showing still another configuration of the multilayer ceramic substrate of the present disclosure. In a multilayer ceramic substrate 104 shown in FIG. 5, the first conductor 404a has an opening that has a generally triangular shape enclosing three via wires 406a. The second conductor 403a also has an opening that has a shape conforming to the shape of the first conductor 404a. None of the first conductor 404a and the second conductor 403a is present in a space between the three via wires 406a. According to such an embodiment, the via wires 406a can be arranged closer to each other, and the effect of increasing the arrangement density of the via wires can be achieved. Note that, in the multilayer ceramic substrate 104, the three via wires 406a are enclosed by the first conductor 404a, although the number of the via wires is not limited to three. The same effect can be achieved so long as two or more via wires 406a are enclosed by the first conductor 404a, and none of the first conductor 404a and the second conductor 403a is provided in a space between the via wires 401a.

Figure 6:
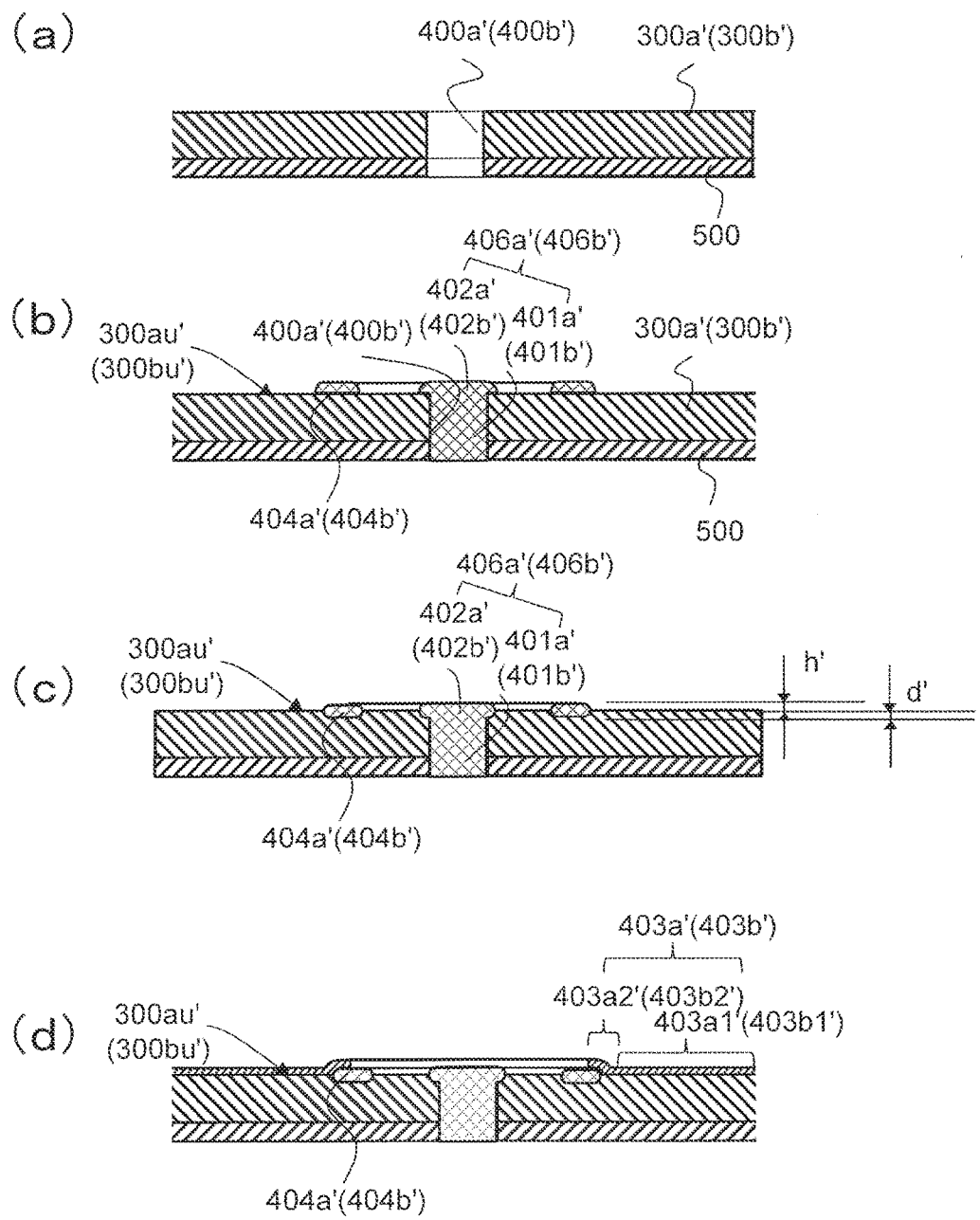
FIGS. 6(a) to 6(d) are stepwise cross-sectional views illustrating still another embodiment of the manufacturing method of the multilayer ceramic substrate.

FIGS. 6(a) to 6(d) are stepwise cross-sectional views illustrating another manufacturing method of the multilayer ceramic substrate of the present disclosure. As shown in FIGS. 6(a) and 6(b), a via hole 400a', 400b' is formed in a ceramic green sheet 300a', 300b' supported by a resin film 500 (first step), and thereafter, a conductor paste is filled into the via hole 400a', 400b' as previously described, whereby a main part pattern 401a', 401b' is formed. Further, on the upper surface 300au', 300bu' of the ceramic green sheet 300a', 300b', a pad pattern 402a', 402b' connecting to the main part pattern 401a', 401b' and a first conductor pattern 404a', 404b' surrounding the pad pattern 402a', 402b' are formed (second step).

Then, as shown in FIG. 6(c), the height h from the upper surface 300au', 300bu' of the pad pattern 402a', 402b' and the first conductor pattern 404a', 404b' is reduced (fifth step). For example, pressure is applied on the pad pattern 402a', 402b' and the first conductor pattern 404a', 404b' using, for example, a plate such that part of the pad pattern 402a', 402b' and the first conductor pattern 404a', 404b' is buried in the ceramic green sheet 300a', 300b', resulting in height h' (h'<h). For example, the value of the ratio h':d' is in the range of not less than ⅓ and not more than 1 (from 1:1 to 1:3) where h' is the height of part of the pad pattern 402a', 402b' and the first conductor pattern 404a', 404b' protruding above the upper surface 300au', 300bu' and d' is the depth of part of the pad pattern 402a', 402b' and the first conductor pattern 404a', 404b' buried in the ceramic green sheet 300a', 300b'. The applied pressure can be, for example, smaller than that applied for preliminarily bonding together stacked ceramic green sheets.

Alternatively, in a region of the upper surface 300au', 300bu' exclusive of the pad pattern 402a', 402b' and the first conductor pattern 404a', 404b', a slurry of the same material as that of the ceramic green sheet 300a' may be printed, and the pad pattern 402a', 402b' and the first conductor pattern 404a', 404b' may be partially buried in the printed slurry.

Thereafter, a conductor paste is printed on the upper surface 300au', 300bu' of the ceramic green sheet 300a', 300b' such that a second conductor pattern 403a', 403b' is formed as shown in FIG. 6(d) (third step). In this step, since the height of the first conductor pattern 404a', 404b' is reduced, the difference in level formed between the first conductor pattern 404a', 404b' and the upper surface 300au', 300bu' is small. Accordingly, the bleeding which can be caused in printing the second conductor pattern 403a', 403b' can be reduced. Subsequently, a multilayer ceramic substrate can be manufactured through the same process as that employed in the above-described embodiment. According to the present embodiment, the bleeding Rn which can be caused in printing the second conductor pattern 403a', 403b' can be reduced. Therefore, the intervals w1, w2 that are determined in consideration of Rn can be further reduced, and a multilayer ceramic substrate can be realized in which via wires are arranged with higher density.

INDUSTRIAL APPLICABILITY

A multilayer ceramic substrate of the present disclosure is applicable to multilayer ceramic substrates of various uses. Particularly, it is suitably used for a multilayer ceramic substrate which includes a via wire, and a ground electrode, a shield electrode, and an inner electrode of a capacitor, for example, a multilayer ceramic substrate for use in a high frequency module or the like.

REFERENCE SIGNS LIST 300a, 300b ceramic green sheet, ceramic layer
400a, 400b via hole
401a, 401b main part of via wire
402a, 402b pad
403a, 403b electrode, second conductor
404a, 404b first conductor

The invention claimed is:
1. A multilayer ceramic substrate, comprising:
a plurality of ceramic layers stacked together;
a via hole provided in each of the plurality of ceramic layers, the via holes of the plurality of ceramic layers being connected together in a layer stacking direction of the plurality of ceramic layers;
a via wire including an electrical conductor filled into each of the via holes;
a first conductor provided on an upper surface of at least one of the plurality of ceramic layers, the first conductor having an annular or partially annular shape surrounding the via wire; and
a second conductor including a first portion and a second portion, the first portion being located outside the first conductor on the upper surface of the at least one ceramic layer, the second portion overlying and directly connected to the upper surface of the first conductor, and an inner rim of the second portion being located outside an inner rim of the first conductor,
wherein a thickness of the first conductor is greater than a thickness of the second conductor,
wherein the via wire further includes a pad formed on at least one of the electrical-conductor-filled via holes of the at least one of the plurality of ceramic layers, the pad being electrically and physically separated from the first conductor,
wherein the second conductor has an opening,
wherein the second conductor is a solid electrode and the first portion of the second conductor extends from the first conductor to the end of the solid electrode,
wherein bottoms of both the first portion of the second conductor and the first conductor are directly on the at least one of the plurality of ceramic layers.
2. The multilayer ceramic substrate of claim 1, wherein the opening of the second conductor is greater than the inner rim of the first conductor, and a rim of the opening is located inside an outer rim of the first conductor.

3. The multilayer ceramic substrate of claim 1, wherein the via wire has the shape of a cylinder or a truncated cone.

4. The multilayer ceramic substrate of claim 3, wherein the first conductor has the shape of a circular ring.

5. The multilayer ceramic substrate of claim 1, wherein the second portion of the second conductor overlies the first conductor.

6. The multilayer ceramic substrate of claim 1, wherein the second conductor is a ground electrode or an inner electrode of a capacitor.

7. The multilayer ceramic substrate of claim 1, wherein each of the plurality of ceramic layers includes another via hole and another via wire which is formed by an electrical conductor filled into the another via hole, in the at least one ceramic layer, the another via wire is surrounded by the first conductor, and the another via wires of the plurality of ceramic layers are connected together.

8. The multilayer ceramic substrate of claim 1, wherein bottoms of both the first portion of the second conductor and the first conductor are on the same plane.

9. A multilayer ceramic substrate, comprising:
a sintered ceramic body including a plurality of ceramic layers;
a via wire buried in the sintered ceramic body;
a first conductor located on a plane generally perpendicular to a center axis of the via wire, the first conductor having an annular or partially annular shape surrounding the via wire on the plane; and
a second conductor including a first portion and a second portion, the first portion being located outside the first conductor on the plane, the second portion overlying and directly connected to the upper surface of the first conductor, and an inner rim of the second portion being located outside an inner rim of the first conductor,
wherein a thickness of the first conductor is greater than a thickness of the second conductor,
wherein the via wire further includes a pad formed on at least one of the electrical-conductor-filled via holes of at least one of the plurality of ceramic layers, the pad being electrically and physically separated from the first conductor,
wherein the second conductor has an opening,
wherein the second conductor is a solid electrode and the first portion of the second conductor extends from the first conductor to the end of the solid electrode,
wherein bottoms of both the first portion of the second conductor and the first conductor are directly on the at least one of the plurality of ceramic layers.

10. A method for manufacturing a multilayer ceramic substrate, comprising:

a first step of forming a via hole in each of a plurality of ceramic green sheets;
a second step of printing a conductor paste on an upper surface of each of the ceramic green sheets, thereby forming a via wire pattern in which the via hole is filled with the conductor paste and forming a first conductor pattern on an upper surface of at least one of the plurality of ceramic green sheets, the first conductor pattern having an annular or partially annular shape surrounding the via wire pattern;
a third step of printing a conductor paste on an upper surface of the at least one ceramic green sheet, thereby forming a second conductor pattern which has a smaller thickness than the first conductor pattern, the second conductor pattern including a first portion and a second portion, the first portion being located outside the first conductor on the upper surface of the at least one ceramic green sheet, the second portion overlying and directly connected to the upper surface of the first conductor, and an inner rim of the second portion being located outside an inner rim of the first conductor; and
a fourth step of stacking up the plurality of ceramic green sheets and connecting the via wire patterns,
wherein the via wire further includes a pad formed on at least one of the electrical-conductor-filled via holes of the at least one of the plurality of ceramic green sheets, the pad being electrically and physically separated from the first conductor pattern,
wherein the second conductor pattern has an opening,
wherein the second conductor pattern is a solid electrode and the first portion of the second conductor pattern extends from the first conductor pattern to the end of the solid electrode, wherein bottoms of both the first portion of the second conductor and the first conductor are directly on the at least one of the plurality of ceramic green sheets.

11. The method of claim 10, wherein
the first step includes forming the via hole by laser or a punch die, and
the via hole has the shape of a cylinder or a truncated cone.

12. The method of claim 10 further comprising, between the second step and the third step, a fifth step of reducing a height of the first conductor pattern.

13. The method of claim 12, wherein the fifth step includes burying part of the first conductor pattern in the ceramic green sheet from the upper surface.

14. The method of claim 10, wherein in the second step the via wire pattern and the first conductor pattern are printed using a same mask.

* * * * *